(12) United States Patent
Julson et al.

(10) Patent No.: US 9,297,848 B2
(45) Date of Patent: Mar. 29, 2016

(54) MODULAR WIRING HARNESS TESTING SYSTEMS AND APPARATUS

(71) Applicant: GM Global Technology Operations LLC, Detroit, MI (US)

(72) Inventors: Timothy D. Julson, Rochester Hills, MI (US); Gary W. Taraski, Oxford, MI (US); Kimberley R. Will, Macomb Township, MI (US); Khara D. Pratt, Redford, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 148 days.

(21) Appl. No.: 13/763,272

(22) Filed: Feb. 8, 2013

(65) Prior Publication Data

US 2013/0221982 A1 Aug. 29, 2013

Related U.S. Application Data

(60) Provisional application No. 61/605,012, filed on Feb. 29, 2012.

(51) Int. Cl.
*G01R 31/11* (2006.01)
*G01R 1/20* (2006.01)
*G01R 31/00* (2006.01)
*G01R 31/04* (2006.01)

(52) U.S. Cl.
CPC ............... *G01R 31/11* (2013.01); *G01R 1/206* (2013.10); *G01R 31/006* (2013.01); *G01R 31/04* (2013.01)

(58) Field of Classification Search
CPC .. G01R 31/021; G01R 31/023; G01R 31/008; G01R 31/041; G01R 31/11; G01R 31/045; G01R 31/2834; G01R 1/0416

USPC .................. 324/539, 503, 508, 66
See application file for complete search history.

(56) References Cited

U.S. PATENT DOCUMENTS

| | | | |
|---|---|---|---|
| 6,856,138 B2 * | 2/2005 | Bohley | 324/534 |
| 7,368,919 B2 * | 5/2008 | Gervais | 324/539 |
| 7,385,406 B1 * | 6/2008 | Blades | 324/713 |
| 7,728,605 B2 * | 6/2010 | Gervais | 324/539 |
| 2008/0238438 A1 | 10/2008 | Gervais | |
| 2011/0253409 A1 * | 10/2011 | Montena | H01R 24/44 174/28 |

FOREIGN PATENT DOCUMENTS

| | | |
|---|---|---|
| CN | 2364631 Y | 2/2000 |
| CN | 2450828 Y | 9/2001 |
| DE | 69902512 T2 | 2/2003 |
| EP | 1041389 B1 | 8/2002 |

OTHER PUBLICATIONS

German Patent and Trade Mark Office, Office Action for German Patent Application No. 10 2013 202 717.6, mailed Feb. 12, 2014.
State Intellectual Property Office of the People's Republic of China, Office Action in Chinese Patent Application No. 201310063734.X mailed Jan. 23, 2015.

* cited by examiner

*Primary Examiner* — Alesa Allgood
(74) *Attorney, Agent, or Firm* — Ingrassia Fisher & Lorenz, P.C.

(57) ABSTRACT

Modular wiring harness testing systems and apparatus are provided for testing wiring harnesses such as those used in the automotive industry. The testing apparatus is configurable (or re-configurable) to test a plurality of different types of wiring harnesses that have different configurations in terms of the number of wires, number of circuits and/or the number, size or type of connectors.

20 Claims, 2 Drawing Sheets

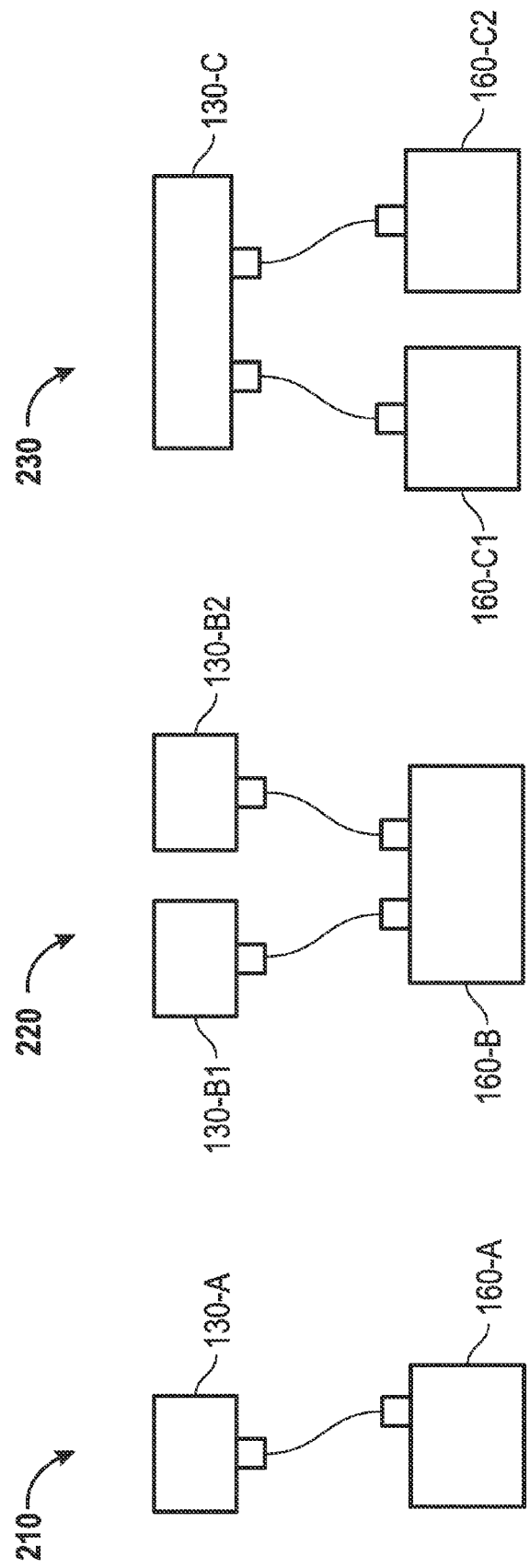

MODULAR WIRING HARNESS TESTING SYSTEMS AND APPARATUS

CROSS-REFERENCES TO RELATED APPLICATIONS

This Application claims priority to U.S. Provisional Application Ser. No. 61/605,012, filed Feb. 29, 2012.

TECHNICAL FIELD

Embodiments of the present invention generally relate to testing wires, and more particularly relate to wiring harness testing systems and apparatus.

BACKGROUND OF THE INVENTION

Suppliers of wiring harnesses often perform a continuity check on each wiring harness at end of the manufacturing process. Continuity checks assure the presence of the circuit in the right cavity of the connector; however it does not provide any indication of the state of health of the wire harness.

Circuit testing of a wire harness is an important phase in the production process. Terminal crimp and wire condition, for example, are some of the key attributes of a wire harness that are not currently checked by the wiring supplier with the continuity tester.

Time-domain reflectometer (TDR) systems can be used to characterize and locate faults in conductive cables such as those used in a wiring harness. To test a wiring harness a signal is sent down a pair of wires and the reflection of this signal is evaluated to find a fault.

Because wiring harnesses have a wide variety of configurations (in terms of the number of wires/circuits they include and/or the number or types of connectors they employ), using TDR systems to test wiring harnesses can be impractical or cost prohibitive. For example, the TDR testing board upon which a switching network is implemented must be re-designed so that its compatible with the particular wiring harness being tested and its specific configuration. For instance, it may be necessary to re-design the switching network that is used so that the system can be used to test a different wiring harness configuration.

Accordingly, it is desirable to provide a system and apparatus for testing a plurality of different types of wiring harnesses. It would be desirable if such systems and apparatus are flexible such that they can be easily adapted to accommodate a wide variety of wiring harnesses produced by different suppliers regardless of their configuration (size, number of wires, connector types, etc.), and can allow the electrical characteristics of those wiring harnesses to be accurately and reliably tested even when the particular configuration varies. Furthermore, other desirable features and characteristics of the present invention will become apparent from the subsequent detailed description and the appended claims, taken in conjunction with the accompanying drawings and the foregoing technical field and background.

SUMMARY

The disclosed embodiments relate to wiring harness testing systems and apparatus.

In one embodiment, a modular wiring harness testing apparatus is provided that is configurable (or re-configurable) to test a plurality of different types of wiring harnesses to detect impedance anomalies therein. Each of the different types of the wiring harnesses have a different configuration that is defined by, for example, a particular number of wires in the wiring harness, a particular number of circuits in the wiring harness, and a particular number of connectors. Each one of the connectors is connected to a set of the wires of the wiring harness. Depending on the wiring harness, the connectors can be different connector types and have different physical sizes, numbers of wires, etc.

In some embodiments, the modular wiring harness testing apparatus can include an enclosure, a plurality of time-domain reflectometer (TDR) engines that are disposed in the enclosure, a plurality of switching networks each being disposed in the enclosure, and a plurality of body holder receptacles.

Each of the body holder receptacles can be coupled to one or more of the switching networks via its own connector system. When a particular connector is inserted into a body holder receptacle that body holder receptacle makes electrical contact with wires of that particular connector. Each of the body holder receptacles is designed to accommodate or receive a plurality of different types of connectors that are used with the different types of wiring harnesses.

Each of switching networks is coupled to one of the TDR engines, and each of the TDR engines are configured to generate test pulses that are used to test the wiring harness being tested. Each connector system is impedance-matched with the body holder receptacle and the switching network to define a delivery path having a uniform impedance to deliver the test pulses to and from one of the wiring harnesses. Each delivery path couples one of the TDR engines to a connector of a wiring harness that is being tested (when that connector is inserted into one of the body holder receptacles), and can carry the test pulses from that TDR engine over a first path to that connector and can carry reflected pulses over a second path from that wiring harness back to that TDR engine. The reflected pulses can then be processed at that TDR engine (e.g., compared to the corresponding ones of the test pulses).

In accordance with the disclosed embodiments, the switching networks and the body holder receptacles are capable of being reconfigured into a number of different configurations. Each of the different configurations is capable of accommodating connectors for one of the plurality of different types of wiring harnesses. This allows each one of the different types of wiring harnesses to be tested by selecting a particular arrangement of the switching networks and the body holder receptacles to accommodate connectors of the particular type of wiring harness that is being tested to allow for testing of particular type of wiring harness.

In one embodiment, an apparatus is provided for testing a plurality of different wiring harnesses. The apparatus comprises at least one time-domain reflectometer (TDR) engine that is configured to generate test pulses, and a plurality of testing modules.

Each of the testing modules comprises: a switching network coupled to the TDR engine, at least one body holder receptacle that is coupled to the switching network, and a connector system that is coupled between the switching network and the body holder receptacle. The body holder receptacle is configured to receive a first connector of a particular wiring harness, and the connector system delivers test pulses to the first connector. The connector system is impedance-matched with the body holder receptacle and the switching network.

In one embodiment, the TDR engine is one of a plurality of TDR engines that include a first TDR engine, and a second TDR engine. In this embodiment, the plurality of testing modules may comprise a first testing module and a second testing module. The first testing module comprises a first switching network coupled to the first TDR engine, a first body holder receptacle that is coupled to the first switching network and configured to receive the first connector of the particular wiring harness; and a first connector system that is coupled between the first switching network and the first body holder receptacle to deliver the test pulses generated by the first TDR engine to the first connector, wherein the first connector system is impedance-matched with the first body holder receptacle and the first switching network. The second testing module comprises a second switching network coupled to the second TDR engine; a second body holder receptacle that is coupled to the second switching network and configured to receive a second connector of the particular wiring harness; and a second connector system that is coupled between the second switching network and the second body holder receptacle to deliver other test pulses generated by the second TDR engine to the second connector, wherein the second connector system is impedance-matched with the second body holder receptacle and the second switching network.

In one particular embodiment, the plurality of testing modules further comprise a third testing module comprising: a third switching network, a third body holder receptacle that is coupled to the third switching network and configured to receive a third connector of the particular wiring harness; and a third connector system that is coupled between the third switching network and the third body holder receptacle to deliver other test pulses, wherein the third connector system is impedance-matched with the third body holder receptacle and the third switching network.

In another embodiment, an apparatus for testing a plurality of different wiring harnesses is provided that includes at least one time-domain reflectometer (TDR) engine that is configured to generate different sets of test pulses for a plurality of testing modules; at least one switching network coupled to the TDR engine; at least one body holder receptacle that is coupled to the at least one switching network and configured to receive at least a first connector of a particular wiring harness; and a connector system that is coupled between the at least one switching network and the at least one body holder receptacle to deliver the test pulses to the first connector of the wiring harness, wherein the connector system is impedance-matched with the at least one body holder receptacle and the at least one switching network.

In another embodiment, an apparatus is provided for testing a plurality of different wiring harnesses. The apparatus comprises a TDR engine and a first testing module. The first testing module comprises a first switching network coupled to the TDR engine; a first body holder receptacle that is coupled to the first switching network and configured to receive a first connector of a particular wiring harness; and a first connector system that is coupled between the first switching network and the first body holder receptacle to deliver the test pulses generated by the TDR engine to the first connector, wherein the first connector system is impedance-matched with the first body holder receptacle and the first switching network.

In some embodiments, the apparatus may further comprise a second body holder receptacle that is coupled to the first switching network and configured to receive a second connector of the particular wiring harness; and a second connector system that is coupled between the first switching network and the second body holder receptacle to deliver other test pulses generated by the TDR engine to the second connector, wherein the second connector system is impedance-matched with the second body holder receptacle and the second switching network. In addition, in some other embodiments, the apparatus may further comprise a second switching network coupled to the TDR engine and the first body holder receptacle; and a second connector system that is coupled between the second switching network and the first body holder receptacle to deliver other test pulses generated by the TDR engine to the first connector, wherein the first connector system is impedance-matched with the second switching network.

DESCRIPTION OF THE DRAWINGS

Embodiments of the present invention will hereinafter be described in conjunction with the following drawing figures, wherein like numerals denote like elements, FIGS. 2A-2C illustrate some non-limiting examples of different configurations of switching network(s) and body holder receptacle(s) that can be used with different wiring harness configurations in accordance with some of the disclosed embodiments.

DESCRIPTION OF EXEMPLARY EMBODIMENTS

Figure 1:
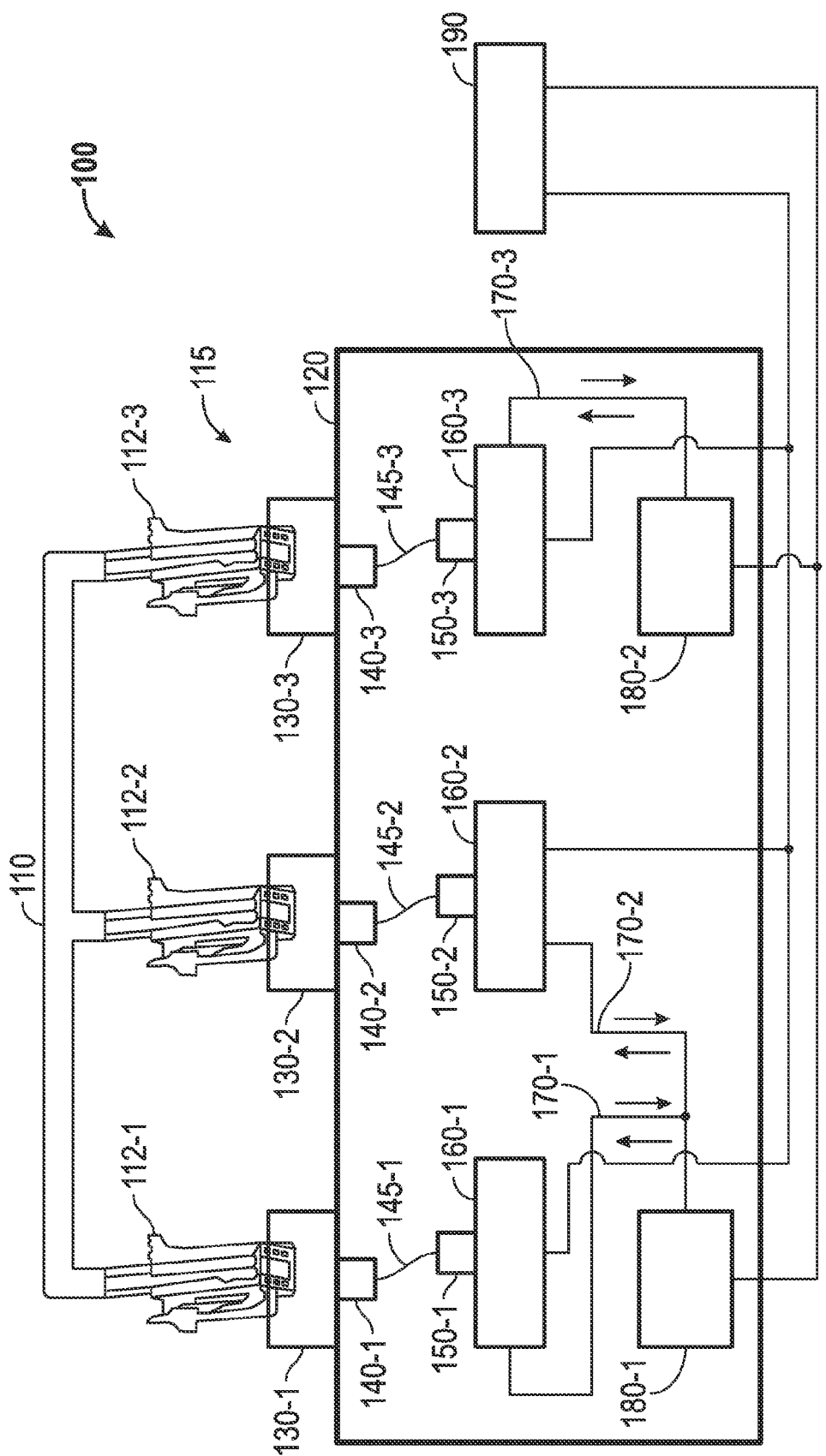
FIG. 1 is a block diagram of a modular wiring harness testing system in accordance with some of the disclosed embodiments.

As used herein, the word "exemplary" means "serving as an example, instance, or illustration." The following detailed description is merely exemplary in nature and is not intended to limit the invention or the application and uses of the invention. Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims. Furthermore, there is no intention to be bound by any expressed or implied theory presented in the preceding technical field, background, brief summary or the following detailed description.

Overview

Before describing in detail embodiments that are in accordance with the present invention, it should be observed that the embodiments relate to modular wiring harness testing systems and apparatus that can be used, for example, in the testing wiring harnesses such as those used in the automotive industry.

FIG. 1 is a block diagram of a modular wiring harness testing system 100 in accordance with some embodiments of the present invention. Among other things, the modular wiring harness test system 100 can be used to detect impedance anomalies in the wiring harnesses 110 that can be used to detect the location(s) of electrical faults within the wiring harnesses 110.

The modular wiring harness test system 100 is configured to test electrical characteristics of a plurality of different wiring harnesses regardless of the number of wires and regardless of the types and sizes of connectors that they include. The configuration of the wiring harness 110 varies depending on the implementation. Each wiring harness 110 can consist of a different number of wires. The various wires of a wiring harness can be connected to one or more connectors 112. As such, a wiring harness 110 can typically include multiple wires and multiple connectors 112 that receive those wires. These connectors 112 can be of different types and have different sizes depending on the particular implementation of the wiring harness 110.

In FIG. 1, a wiring harness 110 is illustrated that includes three connectors 112-1, 112-2, 112-3. This particular example is non-limiting and is shown only for sake of illustrating one exemplary embodiment, however, in other embodiments, the modular wiring harness test system 100 may be configured to test wiring harnesses that have fewer or more connectors. In one embodiment, the wiring harness 110 being tested can be an automotive wiring harness, such as those that are incorporated within a door of a vehicle The modular wiring harness test system 100 includes a modular wiring harness test apparatus 115 that includes a number of testing modules (not labeled) that are coupled to and controlled by a general purpose computer 190. Other optional components that are not illustrated can include, for example, a Universal Serial Bus (USB) hub, an electrical power supply, cooling fans, and peripheral computer components such as a display, a scanner, and a printer. The general purpose computer 190 and other components can be coupled together via the USB hub (not illustrated).

When many different types of wiring harnesses will potentially be tested it is desirable to have flexibility so that each potential wiring harness 110 and its corresponding connector configurations 112 can be tested using a single apparatus.

In accordance with the disclosed embodiments, the modular wiring harness test apparatus 115 includes a plurality of testing modules that are disposed on and/or within an enclosure 120. These testing modules can be used to test a wide variety of wiring harness configurations.

Each of the testing modules can include a plurality of body holder receptacles 130 (e.g., disposed on the enclosure 120), a plurality of switching networks 160, a plurality of time-domain reflectometer (TDR) engines 180, and connector systems (sometimes referred to as jumper harnesses) 140/145/150 that can be disposed within the enclosure 120.

Each body holder receptacle 130 is configured to receive a connector 112 of a wiring harness 110 such that test pulses can be delivered to that connector 112. Each of the connectors 112 of the wiring harness 110 can be coupled to a corresponding body holder receptacle 130 (that it is received by) so that each body holder receptacle 130 makes electrical contact with wires of that particular connector 112. Each body holder receptacle 130 has a particular configuration that allows it to accommodate different types of connectors, and that particular configuration can vary depending on the implementation. For example, each body holder receptacle 130 can accommodate a wide variety of different types and/or sizes of wiring harness connectors 112, where size can refer to physical size of a particular connector and/or the maximum number of wires that can be accommodated by a particular connector.

Each switching network 160 can be implemented on a solid state switching board (according to one non-limiting, exemplary implementation). Each switching network 160 is configured to be coupled to at least one body holder receptacle 130 via one of the connector systems 140/145/150, as will now be described below. Each switching network 160 can be programmed and reconfigured via the computer 190 to put the switching network in different configurations that allow it to be configured for use in testing of different wiring harnesses and different connectors 112.

It is desirable for each delivery path, that is used to carry test pulses, has substantially uniform impedance. In the example illustrated in FIG. 1, this delivery path is from the time-domain reflectometer (TDR) engine 180, through the switching network 160 (that can be implemented on a solid state switching board), through the second connector 150 to the cable 145 and then to the first connector 140 that is coupled to a connector 112 of the wiring harnesses 110.

In accordance with the disclosed embodiments, each of the testing modules can be coupled to a corresponding connector 112 of the wiring harness 110 via a uniform, impedance-matched delivery path that is used to carry test pulses to the wiring harnesses 110 and to carry reflected pulses back to the testing modules. The connector systems 140/145/150 each include first and second connectors 140, 150 coupled via a cable 150 that is impedance matched with its corresponding body holder receptacle 130 and the switching network 160 that it is coupled between. The connector systems 140/145/150 have circuits equal in circuit length (to keep the impedance of the circuit under test substantially equal).

As illustrated in FIG. 1, each wiring harness body holder receptacle 130 is coupled to one of the switching networks 160 by an impedance-matched connector system that includes a first connector 140 that is electrically and physically coupled to a connector 112 held in the body holder receptacle 130, a second connector 150 that is electrically coupled to the switching network 160, and a cable 145 that couples the first connector 140 to the second connector 150. Each switching network 160 can include a second connector 150 that is coupled to a corresponding first connector 140 of the body holder receptacle 130 via a cable 145. In accordance with one embodiment, each second connector 150 is removable for maintenance and future changes.

The components (e.g., first connector 140, cable 145, second connector 150) of each connector system are impedance-matched meaning the circuits including the terminals in each cable have a matched impedance. In one embodiment, the second connector 150 includes spring loaded pogo pins that contact a terminal tip or end of the wiring harness 110 under test. Impedance matching creates a uniform delivery system in which the impedance between each connector of the wiring harness and body holder receptacle 130 and the other components of the modular wiring harness test apparatus 115 is substantially matched.

The time-domain reflectometer (TDR) engines 180 and the switching networks 160 of the modular wiring harness test apparatus 115 can be coupled to and controlled by the computer 190 (for example, by a USB hub).

Each of the switching networks 160 are coupled to one of the time-domain reflectometer (TDR) engines 180, and is configured to direct the test pulses received from its corresponding time-domain reflectometer (TDR) engine 180 to the connection system (e.g., to one of the pogo pins in the connector holder second connector holder 150) that it is coupled to, and to carry reflected pulses (from the wiring harnesses 110) back to its corresponding time-domain reflectometer (TDR) engine 180. In one embodiment, each switching network 160 can be implemented using a solid state switching board. The solid state switching boards include solid state circuitry that is impedance matched to corresponding cable 145 that it is coupled to for improved transport of the test pulses and reflected pulses.

TDR Engines

Each time-domain reflectometer (TDR) engine 180 is configured to generate and output outbound test pulses to at least one switching network 160, and is configured to receive and process inbound reflected test pulses received from the wiring harness under test via at least one switching network 160. For example, in one non-limiting embodiment, each time-domain reflectometer (TDR) engine 180 can generate and output multiples of $2^N$ outbound test pulses, and in one implementation, N=5 such that each time-domain reflectometer (TDR) engine 180 can generate 32 test pulses per test cycle.

Because the modular wiring harness test apparatus 115 includes multiple receptacles 130, multiple switching networks 160, and multiple TDR engines 180, this allows for multiple pairs of circuits in a wiring harness to be tested with a single testing apparatus.

In one embodiment, a plurality of paired channels 170 are used to couple each time-domain reflectometer (TDR) engine 180 to at least one of the switching network 160. For instance, each of the paired channels includes a high path that carries outbound test pulses from the time-domain reflectometer (TDR) engine 180 to the switching network 160, and a low path that carries reflected pulses received from the wiring harness by the switching network 160 back to the time-domain reflectometer (TDR) engine 180 for processing and comparison to a corresponding outbound test pulse. In the one non-limiting example, each time-domain reflectometer (TDR) engine 180 has two sets of paired channels, such that a total of four paths are shared between each of the time-domain reflectometer (TDR) engines 180 and a corresponding switching network 160. In other implementations fewer or more sets of pair channels 170 can be implemented.

Operation of TDR Engines

Each of the time-domain reflectometer (TDR) engines 180 is an electronic instrument that can be used to characterize and locate faults in conductive cables (for example, wire pairs, coaxial cables), such as those used in a wiring harness 110. Each of the time-domain reflectometer (TDR) engines 180 can also be used to locate discontinuities in terminals, switching network, or any other electrical path.

During testing of a particular wiring harness 110, its wires can be segregated into pairs of wires or circuits that are to be tested. Each TDR engine 180 sequentially transmits test pulses (having relatively short rise-times) to a pair of circuits of the wiring harness 110 being tested. If the conductors in that circuit of the wiring harness have a uniform impedance and are properly terminated, the entire transmitted test pulse will be absorbed and no signal will be reflected back toward the TDR engine 180. By contrast, if any impedance discontinuities are present, they will cause some of the test pulse to be reflected back towards the TDR engine 180. For example, increases in the impedance create a reflected pulse (or reflection) that reinforces the original test pulse, whereas decreases in the impedance create a reflected pulse that opposes the original test pulse.

For instance, if a particular circuit of a wiring harness 110 were shorted (that is, it is terminated into zero ohms impedance), then when the rising edge of the test pulse is received, the voltage at the launching point "steps up" to a given value instantly and the test pulse begins propagating down that circuit of the wiring harness towards the short. When the test pulse hits the short, no energy is absorbed at the far end. Instead, an opposing reflected pulse reflects back from the short towards the launching end. It is only when this opposing reflection finally reaches the launch point that the voltage at this launching point abruptly drops back to zero, which signals the fact that there is a short. The signal propagation speed in the particular wiring harness 110 can be used to determine the distance to the short.

By contrast, if the far end of a particular circuit in the wiring harness is an open circuit (terminated into an infinite impedance), the pulse reflected from the far end will be polarized identically with the original test pulse and adds to it rather than cancelling it out. So after a round-trip delay, the voltage at the TDR engine abruptly jumps to about twice the originally-applied voltage. A theoretical perfect termination at the far end of a circuit of the wiring harness would entirely absorb the applied pulse without causing any reflection; however, perfect terminations are very rare and in most cases some of the energy will be reflected back to the TDR engine 180 as a reflected pulse.

Each TDR engine 180 includes circuitry for measuring the reflected pulses received by the TDR engine 180. These reflected pulses can be displayed at display (not illustrated) or plotted as a function of time. Because the speed of signal propagation is almost constant for a given transmission medium (the test pulse velocity is primarily affected by the permittivity of the medium through which the pulse propagates), the time difference between when the test pulse was sent and when the reflected pulse was returned can be determined, and used to determine information about the location of the impedance variation (e.g., the TDR engine 180 can be used to verify impedance characteristics, estimate cable lengths, determine the location of faults in the wiring harness 110 and associated losses, etc.).

During testing of a particular wiring harness 110, a particular configuration of one or more switching network(s) 160 and one or more body holder receptacle(s) 130 can be selected for testing that particular wiring harness 110. The configuration that is selected depends on characteristics of that particular wiring harness 110 including number of wires, overall number and sizes of their corresponding connectors, and/or the types of connectors that the wires of that particular wiring harness are coupled to. The modular configuration of the wiring harness test apparatus 115 allows it to handle a large number of connector types and sizes that are used with different wiring harnesses, which also simplifies the number of switching networks 160 (e.g., reduces the overall number of switch board configurations) that are required to test different types of wiring harnesses that can have different wiring harness configurations.

FIGS. 2A-2C illustrate some non-limiting examples of different configurations of switching network(s) 160 and body holder receptacle(s) 130 that can be used with different wiring harness configurations (not illustrated).

FIG. 2A illustrates one non-limiting example of a configuration 210 that includes one switching network 160-A (that can be implemented on a solid state switching board in one implementation) and one body holder receptacle 130-A.

The switching network 160-A can be coupled to a TDR engine (not illustrated). The body holder receptacle 130-A is coupled to the switching network 160-A and is configured to receive a connector of a particular wiring harness. As above, a first connector system is coupled between the switching network 160-A and the body holder receptacle 130-A to deliver the test pulses generated by the TDR engine (to the connector of the wiring harness). The connector system is impedance-matched with the body holder receptacle 130-A and the switching network 160-A.

This configuration 210 can be used to accommodate all variations of connectors that are used with wiring harnesses having a certain maximum number of wires or circuits to be tested. In this example, the body holder receptacle 130-A can accommodate a connector of a wiring harness having up to a particular circuit count (X). This body holder receptacle 130-A is designed to accommodate a connector of a particular wiring harness configuration having (up to) a particular number of wires or circuit count. In other words, this example configuration 210 is designed to work with wiring harnesses that have a circuit count of up to X or 2X pairs of wires that need to be tested. The switching network 160-A is designed to be used with any connector (types and sizes) that fall within this circuit count (X).

FIG. 2B illustrates one non-limiting example of a configuration 220 that includes one switching network 160-B (that can be implemented on a solid state switching board in one implementation) and two body holder receptacles 130-B1, 130-B2.

The switching network 160-B can be coupled to a TDR engine (not illustrated). The two body holder receptacles 130-B1, 130-B2 are coupled to the switching network 160-B and configured to receive two different connectors of a particular wiring harness. As above, a first connector system is coupled between the switching network 160-B and the body holder receptacle 130-B1 to deliver test pulses generated by a TDR engine (to the connector of the wiring harness), and a second connector system is coupled between the switching network 160-B and the body holder receptacle 130-B2 to deliver other test pulses generated by the TDR engine (to the other connector of the wiring harness) or another TDR engine.

The connector systems are impedance-matched with the respective body holder receptacles 130-B1, 130-B2 and the switching network 160-B. This configuration 220 can be used to accommodate all variations of connectors that are used with wiring harnesses having a certain maximum number of wires or circuits to be tested.

In this example, the body holder receptacles 130-B1, 130-B2 can each accommodate connectors of a wiring harness having (up to) a particular number of wires or a particular circuit count (Y), where Y is greater than X described above. In other words, this example configuration 220 is designed to work with wiring harnesses that have a circuit count of up to Y (or 2Y pairs of wires that need to be tested). The switching network 160-B is designed to be used with any connector (types and sizes) that fall within this circuit count (Y).

FIG. 2C illustrates yet another non-limiting example of a configuration 230 that includes two switching networks 160-C1, 160-C2 and one body holder receptacle 130-C.

The two switching networks 160-C1, 160-C2 can be coupled to either the same TDR engine or to separate TDR engines (not illustrated). A single body holder receptacle 130-C is coupled to both switching networks 160-C1, 160-C2 and is configured to receive a connector of a particular wiring harness. In this embodiment, a first connector system is coupled between the first switching network 160-C1 and the body holder receptacle 130-C to deliver the test pulses generated by a TDR engine (to the connector of the wiring harness) and a second connector system is coupled between the second switching network 160-C2 and the body holder receptacle 130-C to deliver other test pulses generated by a TDR engine (to the same connector of the wiring harness). The connector systems are impedance-matched with the body holder receptacle 130-C and their respective switching networks 160-C1, 160-C2.

This configuration 230 can be used to accommodate all variations of connectors that are used with wiring harnesses having a certain maximum number of wires or circuits to be tested. In this example, the body holder receptacle 130-C can accommodate a connector of a particular wiring harness configuration having up to a particular number of wires or a particular circuit count (Z), where Z is greater than X and Y described above. In other words, this example configuration 230 is designed to work with wiring harnesses that have a circuit count of up to Z or 2Z pairs of wires that need to be tested. The switching network 160-C is designed to be used with any connector (any type and size) that fall within this circuit count (Z).

Conclusion

One of the benefits of the wiring harness test apparatus 115 is that the modular design makes it easy to maintain, service and update. This modularity (e.g., of the first connector holders 140, the second connector holders 150, the switching networks 160 (that can each be implemented on a separate solid state switching board), and the time-domain reflectometer (TDR) engines 180) makes the modular wiring harness test apparatus 115 flexible and easy to reconfigure as needed to accommodate wiring harnesses from a wide variety of suppliers, and also to allow for easy changes to accommodate future design changes.

The disclosed systems and apparatus allow for the characteristic impedance of a wire harness to be checked. The test apparatus 115 includes TDR engines that can be used to generate test pulses that can be used to check for small impedance anomalies that may be indicative of electrical faults. The test apparatus 115 has uniform delivery paths to the wiring harness 110 under test. By providing a delivery path for pulses (i.e., test pulses and reflected pulses) that has a uniform impedance (e.g., that is matched with the cable 145), this allows for continuity tests to be conducted in parallel on multiple circuits within a wiring harness 110. This also allows for testing of circuits in pairs including testing resistance to determine bad circuit in a pair, and for other testing including detection of circuit mis-indexes, opens, shorts, and terminal crimp quality, etc. Measured data can be compared with predetermined gold source standard values for that particular wiring harness construction with associated components such as wire type, terminals and connectors.

Those of skill in the art would further appreciate that the various illustrative logical blocks, modules, circuits, and algorithm steps described in connection with the embodiments disclosed herein may be implemented as electronic hardware, computer software, or combinations of both. Some of the embodiments and implementations are described above in terms of functional and/or logical block components (or modules) and various processing steps. However, it should be appreciated that such block components (or modules) may be realized by any number of hardware, software, and/or firmware components configured to perform the specified functions. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention. For example, an embodiment of a system or a component may employ various integrated circuit components, e.g., memory elements, digital signal processing elements, logic elements, look-up tables, or the like, which may carry out a variety of functions under the control of one or more microprocessors or other control devices. In addition, those skilled in the art will appreciate that embodiments described herein are merely exemplary implementations The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. The word "exemplary" is used exclusively herein to mean "serving as an example, instance, or illustration." Any embodiment described herein as "exemplary" is not necessarily to be construed as preferred or advantageous over other embodiments.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal In the alternative, the processor and the storage medium may reside as discrete components in a user terminal In this document, relational terms such as first and second, and the like may be used solely to distinguish one entity or action from another entity or action without necessarily requiring or implying any actual such relationship or order between such entities or actions. Numerical ordinals such as "first," "second," "third," etc. simply denote different singles of a plurality and do not imply any order or sequence unless specifically defined by the claim language. The sequence of the text in any of the claims does not imply that process steps must be performed in a temporal or logical order according to such sequence unless it is specifically defined by the language of the claim. The process steps may be interchanged in any order without departing from the scope of the invention as long as such an interchange does not contradict the claim language and is not logically nonsensical.

Furthermore, depending on the context, words such as "connect" or "coupled to" used in describing a relationship between different elements do not imply that a direct physical connection must be made between these elements. For example, two elements may be connected to each other physically, electronically, logically, or in any other manner, through one or more additional elements.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A modular automotive wiring harness testing apparatus that is configurable to test a plurality of different types of automotive wiring harnesses to detect impedance anomalies therein, wherein each particular automotive wiring harness comprises a plurality of connectors, the modular automotive wiring harness testing apparatus comprising:

an enclosure;

a plurality of time-domain reflectometer (TDR) engines that are disposed in the enclosure and that are each configured to generate test pulses;

a plurality of switching networks each being coupled to one of the TDR engines and each being disposed in the enclosure, wherein each of the plurality of switching networks are configured to be programmed and reconfigured into a number of different configurations, wherein each of the different configurations configures a particular switching network to allow that particular switching network to test a particular one of the plurality of different types of automotive wiring harnesses;

a plurality of body holder receptacles disposed on the enclosure, wherein each of the body holder receptacles is coupled to one or more of the switching networks via a connector system, wherein each connector system is impedance-matched with the body holder receptacle and the switching network to define a delivery path having a uniform impedance to deliver the test pulses to and from one of the connectors of a particular automotive wiring harness, wherein each of the body holder receptacles has a particular configuration that allows it to receive and accommodate different types of connectors that are used with the different types of automotive wiring harnesses.

2. A modular automotive wiring harness testing apparatus according to claim 1, wherein the switching networks and the body holder receptacles are capable of being reconfigured into a number of different configurations, wherein each of the different configurations is capable of accommodating connectors for one of the plurality of different types of automotive wiring harnesses, and allows for testing of a particular one of the plurality of different types of automotive wiring harnesses.

3. A modular automotive wiring harness testing apparatus according to claim 1, wherein a particular arrangement of the switching networks and the body holder receptacles is selected to accommodate connectors of one particular type of automotive wiring harness to allow for testing of that one particular type of automotive wiring harness.

4. A modular automotive wiring harness testing apparatus according to claim 1, wherein each delivery path is:

coupled between one of the TDR engines and a connector of an automotive wiring harness when that connector is inserted into one of the body holder receptacles, and configured to carry the test pulses from that TDR engine over a first path to that connector and to carry reflected pulses over a second path from that automotive wiring harness back to that TDR engine for processing including comparison to the corresponding ones of the test pulses.

5. A modular automotive wiring harness testing apparatus according to claim 1, wherein each of the different types of the automotive wiring harnesses have a different configuration defined by:

a particular number of wires in the automotive wiring harness;

a particular number of circuits in the automotive wiring harness, wherein each of the circuits includes a pair of the wires of the automotive wiring harness; and a particular number of connectors each having a particular connector type and a particular physical size, wherein each one of the connectors is connected to a set of the wires of the automotive wiring harness, and wherein the different types of connectors have different physical sizes or a different number of wires.

6. A modular automotive wiring harness testing apparatus according to claim 1, wherein each particular automotive wiring harness includes a plurality of different circuits, and wherein each of the plurality of body holder receptacles is configured to receive a different connector of a particular automotive wiring harness to allow for a particular one of the different circuits in that particular automotive wiring harness to be tested using one of the TDR engines and at least one of the switching networks that has been specifically configured to test that particular automotive wiring harness such the plurality of different circuits of that particular automotive wiring harness are tested at the same time.

7. An apparatus for testing a plurality of different automotive wiring harnesses, wherein each particular automotive wiring harness comprises a plurality of connectors, the apparatus comprising:
   a time-domain reflectometer (TDR) engine that is configured to generate test pulses; and
   a plurality of testing modules, wherein each of the testing modules comprises:
      a switching network coupled to the TDR engine, wherein each switching network is configured to be programmed and reconfigured into a number of different configurations, wherein each of the different configurations configures that particular switching network to allow that particular switching network to test a particular one of the plurality of different types of automotive wiring harnesses;
      a body holder receptacle that is coupled to the switching network and configured to receive a first connector of a particular automotive wiring harness, wherein each of the body holder receptacles has a particular configuration that allows it to receive and accommodate different types of connectors that are used with the different types of automotive wiring harnesses; and
      a connector system that is coupled between the switching network and the body holder receptacle to deliver the test pulses to the first connector of the automotive wiring harness,
      wherein the connector system is impedance-matched with the body holder receptacle and the switching network to define a delivery path having a uniform impedance to deliver the test pulses to and from the first connector of a particular automotive wiring harness.

8. An apparatus according to claim 7, wherein each particular automotive wiring harness includes a plurality of different circuits, and wherein each of the body holder receptacles is configured to receive a different connector of the particular automotive wiring harness to allow for a particular one of the different circuits in that particular automotive wiring harness to be tested using the TDR engine and at least one of the switching networks that has been specifically configured to test that particular automotive wiring harness such the plurality of different circuits of that particular automotive wiring harness are tested at the same time.

9. An apparatus according to claim 7, wherein the TDR engine comprises a first TDR engine, and further comprising a second TDR engine, and wherein the plurality of testing modules, comprise:
   a first testing module, comprising:
      a first switching network coupled to the first TDR engine;
      a first body holder receptacle that is coupled to the first switching network and configured to receive the first connector of the particular automotive wiring harness; and
      a first connector system that is coupled between the first switching network and the first body holder receptacle to deliver the test pulses generated by the first TDR engine to the first connector, wherein the first connector system is impedance-matched with the first body holder receptacle and the first switching network; and
   a second testing module, comprising:
      a second switching network coupled to the second TDR engine;
      a second body holder receptacle that is coupled to the second switching network and configured to receive a second connector of the particular automotive wiring harness; and
      a second connector system that is coupled between the second switching network and the second body holder receptacle to deliver other test pulses generated by the second TDR engine to the second connector, wherein the second connector system is impedance-matched with the second body holder receptacle and the second switching network.

10. An apparatus according to claim 9, wherein the plurality of testing modules further comprise:
   a third testing module, comprising:
      a third switching network;
      a third body holder receptacle that is coupled to the third switching network and configured to receive a third connector of the particular automotive wiring harness; and
      a third connector system that is coupled between the third switching network and the third body holder receptacle to deliver other test pulses, wherein the third connector system is impedance-matched with the third body holder receptacle and the third switching network.

11. An apparatus for testing a plurality of different automotive wiring harnesses, wherein each particular automotive wiring harness comprises a plurality of connectors, the apparatus comprising:
   a time-domain reflectometer (TDR) engine; and
   a first testing module, comprising:
      a first switching network coupled to the TDR engine, wherein the first switching network is configured to be programmed and reconfigured into a number of different configurations, wherein each of the different configurations configures that the first switching network to allow the first switching network to test a particular one of the plurality of different types of automotive wiring harnesses;
      a first body holder receptacle that is coupled to the first switching network and configured to receive a first connector of a particular automotive wiring harness, wherein the first body holder receptacle has a particular configuration that allows it to receive and accommodate different types of connectors that are used with the different automotive wiring harnesses; and
      a first connector system that is coupled between the first switching network and the first body holder receptacle to deliver the test pulses generated by the TDR engine to the first connector, wherein the first connector system is impedance-matched with the first body holder receptacle and the first switching network to define a delivery path having a uniform impedance to deliver the test pulses to and from the first connector of a particular automotive wiring harness.

12. An apparatus according to claim 11, further comprising:

a second body holder receptacle that is coupled to the first switching network and configured to receive a second connector of the particular automotive wiring harness; and a second connector system that is coupled between the first switching network and the second body holder receptacle to deliver other test pulses generated by the TDR engine to the second connector, wherein the second connector system is impedance-matched with the second body holder receptacle and the second switching network.

13. An apparatus according to claim 12, further comprising:

a second switching network coupled to the TDR engine and the first body holder receptacle; and a second connector system that is coupled between the second switching network and the first body holder receptacle to deliver other test pulses generated by the TDR engine to the first connector, wherein the first connector system is impedance-matched with the second switching network.

14. A modular automotive wiring harness testing apparatus is configurable to test a plurality of different types of automotive wiring harnesses to detect impedance anomalies therein, wherein each particular automotive wiring harness comprises a plurality of connectors, the modular automotive wiring harness testing apparatus comprising:

an enclosure;

at least one time-domain reflectometer (TDR) engine that is disposed in the enclosure and is configured to generate test pulses;

a plurality of testing modules being disposed on and in the enclosure, wherein each of the testing modules comprises:

at least one switching network coupled to the TDR engine, wherein the at least one switching network is configured to be programmed and reconfigured into a number of different configurations, wherein each of the different configurations configures the at least one switching network to allow the at least one switching network to test a particular one of the plurality of different types of automotive wiring harnesses;

at least one body holder receptacle that is coupled to the at least one switching network, wherein the body holder receptacle is configured to receive a plurality of different types of connectors, wherein the at least one body holder receptacle has a particular configuration that allows it to receive and accommodate different types of connectors that are used with the different types of automotive wiring harnesses; and a connector system that is coupled between the switching network and the body holder receptacle to deliver the test pulses to the body holder receptacle, wherein the connector system is impedance-matched with the body holder receptacle and the switching network to define a delivery path having a uniform impedance to deliver the test pulses to and from one of the connectors of a particular automotive wiring harness.

15. A modular automotive wiring harness testing apparatus according to claim 14, wherein each of the different types of the automotive wiring harnesses have a different configuration defined by:

a particular number of wires in the automotive wiring harness;

a particular number of circuits in the automotive wiring harness, wherein each of the circuits includes a pair of the wires of the automotive wiring harness; and a particular number of connectors each having a particular connector type and a particular physical size, wherein each one of the connectors is connected to a set of the wires of the automotive wiring harness, and wherein the different types of connectors have different physical sizes or a different number of wires.

16. A modular automotive wiring harness testing apparatus according to claim 14, wherein each delivery path is: coupled between the TDR engine and a connector when the connector is inserted into one of the body holder receptacles, and configured to carry the test pulses from the TDR engine over a first path to the connector and to carry reflected pulses over a second path from an automotive wiring harness back to the TDR engine for processing including comparison to the corresponding ones of the test pulses.

17. A modular automotive wiring harness testing apparatus according to claim 14, wherein each body holder receptacle makes electrical contact with wires of a particular connector when the particular connector is inserted into that body holder receptacle, and wherein the different types of connectors have different physical sizes or a different number of wires.

18. A modular automotive wiring harness testing apparatus according to claim 14, wherein each particular automotive wiring harness includes a plurality of different circuits, and wherein each of the plurality of body holder receptacles is configured to receive a different connector of a particular automotive wiring harness to allow for a particular one of the different circuits in that particular automotive wiring harness to be tested using one of the TDR engines and at least one of the switching networks that has been specifically configured to test that particular automotive wiring harness such the plurality of different circuits of that particular automotive wiring harness are tested at the same time.

19. A modular automotive wiring harness testing apparatus according to claim 14, wherein the switching networks and the body holder receptacles are capable of being reconfigured into different configurations to test each of the plurality of different types of automotive wiring harnesses, wherein each of the different configurations is capable of accommodating connectors for one of the plurality of different types of automotive wiring harnesses, and allows for testing of a particular one of the plurality of different types of automotive wiring harnesses.

20. A modular automotive wiring harness testing apparatus according to claim 19, wherein a particular arrangement of the switching networks and the body holder receptacles is selected to accommodate a first connector of one particular type of automotive wiring harness to allow for testing of that one particular type of automotive wiring harness.

* * * * *